(12) United States Patent
Kim et al.

(10) Patent No.: US 10,714,548 B2
(45) Date of Patent: Jul. 14, 2020

(54) ORGANIC LIGHT-EMITTING DISPLAY DEVICE AND MANUFACTURING METHOD THEREOF

(71) Applicant: LG DISPLAY CO., LTD., Seoul (KR)

(72) Inventors: Dohyung Kim, Paju-si (KR); Jonghyeok Im, Paju-si (KR); Jaesung Lee, Paju-si (KR); Seungwon Yoo, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/223,980

(22) Filed: Dec. 18, 2018

(65) Prior Publication Data

US 2019/0198800 A1 Jun. 27, 2019

(30) Foreign Application Priority Data

Dec. 22, 2017 (KR) ........................ 10-2017-0178572

(51) Int. Cl.
*H01L 27/32* (2006.01)
*H01L 51/52* (2006.01)
*H01L 51/56* (2006.01)

(52) U.S. Cl.
CPC .......... *H01L 27/3246* (2013.01); *H01L 27/32* (2013.01); *H01L 27/326* (2013.01); *H01L 27/3241* (2013.01); *H01L 27/3244* (2013.01); *H01L 27/3248* (2013.01); *H01L 27/3258* (2013.01); *H01L 27/3262* (2013.01); *H01L 27/3276* (2013.01); *H01L 27/3283* (2013.01); *H01L 27/3288* (2013.01); *H01L 51/5203* (2013.01); *H01L 51/5228* (2013.01); *H01L 51/5234* (2013.01); *H01L 51/56* (2013.01); *H01L 2227/323* (2013.01); *H01L 2251/5315* (2013.01)

(58) Field of Classification Search
CPC . H01L 27/32; H01L 27/3241; H01L 27/3244; H01L 27/3246; H01L 27/3248; H01L 27/3258; H01L 27/326; H01L 27/3262; H01L 27/3276; H01L 27/3283; H01L 27/3288; H01L 51/5203
See application file for complete search history.

(56) References Cited

U.S. PATENT DOCUMENTS

| | | | | |
|---|---|---|---|---|
| 9,748,318 | B2* | 8/2017 | Shim | H01L 27/3246 |
| 10,079,276 | B2* | 9/2018 | Park | H01L 27/3272 |
| 2012/0162053 | A1* | 6/2012 | Lee | H01L 27/3279 345/80 |
| 2015/0187274 | A1* | 7/2015 | Kim | G09G 3/3258 345/212 |

(Continued)

*Primary Examiner* — Eduardo A Rodela
(74) *Attorney, Agent, or Firm* — Birch, Stewart, Kolasch & Birch, LLP

(57) ABSTRACT

An organic light-emitting display device can include a low-level voltage line that receives a low-level voltage, a plurality of insulating layers that lie over the low-level voltage line, an auxiliary electrode that lies on the insulating film layer and is formed through the insulating film layer and electrically connected to the low-level voltage line, a bank layer that lies over the auxiliary electrode and defines a light-emitting area where the organic light-emitting diode is located, and a cathode of the organic light-emitting diode that lies on the bank layer and at least makes contact with the side of the auxiliary electrode.

9 Claims, 4 Drawing Sheets

(56) References Cited

U.S. PATENT DOCUMENTS

| | | | |
|---|---|---|---|
| 2016/0043341 A1* | 2/2016 | Heo | H01L 27/3246 257/40 |
| 2016/0079334 A1* | 3/2016 | Lee | H01L 51/56 257/40 |
| 2016/0293888 A1* | 10/2016 | Shim | H01L 27/3246 |
| 2018/0097047 A1* | 4/2018 | Jung | H01L 27/3246 |
| 2018/0122882 A1* | 5/2018 | Lee | H01L 27/1248 |
| 2019/0189708 A1* | 6/2019 | Lee | H01L 51/5012 |
| 2019/0198582 A1* | 6/2019 | Yeo | H01L 27/3223 |
| 2019/0198805 A1* | 6/2019 | Kim | H01L 51/5228 |

\* cited by examiner

ORGANIC LIGHT-EMITTING DISPLAY DEVICE AND MANUFACTURING METHOD THEREOF

CROSS-REFERENCE TO RELATED APPLICATION

This application claims the priority benefit of Korean Patent Application No. 10-2017-0178572, filed in the Republic of Korea on Dec. 22, 2017, which is incorporated herein by reference for all purposes as if fully set forth herein.

BACKGROUND OF THE INVENTION

Field of the Invention

The present invention relates to an organic light-emitting display device and a manufacturing method thereof.

Related Art

Organic light-emitting displays, which are a type of flat panel displays, are self-luminous displays that emit light through excitation of organic compounds. In contrast to liquid crystal displays (LCDs), the organic light-emitting displays work without a backlight; thus, the organic light-emitting displays can be lighter and thinner and made in a simplified process. Also, the organic light emitting displays are widely used because they can be manufactured at low temperatures, have a fast response time of 1 ms or less, and feature low power consumption, wide viewing angle, and high contrast.

In an organic light-emitting display device, an organic light-emitting diode comprises an anode that receives a voltage proportional to a data voltage and a cathode that receives a low-level voltage, and emits light in response to a drive current flowing between the anode and cathode. The organic light-emitting display device displays brightness in proportion to a drive current, and the drive current is proportional to the amount of voltage across the cathode. The cathode in each pixel comprising an organic light-emitting diode can be implemented as a transparent electrode located on the front of a substrate. In this case, the cathode receives a low-level voltage through a pad located on the edge of a display panel. Thus, the level of voltage applied to the cathode varies with the position of the pixel due to a voltage drop. As a result, even pixels that receive the same data voltage can show variations in brightness depending on their position on the display panel.

SUMMARY OF THE INVENTION

An example of the present invention provides an organic light-emitting display device which addresses the limitations and disadvantages associated with the related art.

An example embodiment of the present invention provides an organic light-emitting display device comprising a low-level voltage line that receives a low-level voltage, a plurality of insulating layers that lie over the low-level voltage line, an auxiliary electrode that lies on the insulating layer and is formed through the insulating layer and electrically connected to the low-level voltage line, a bank layer that lies over the auxiliary electrode and defines a light-emitting area where an organic light-emitting diode is located, and a cathode of the organic light-emitting diode that lies on the bank layer and at least makes contact with the side of the auxiliary electrode.

BRIEF DESCRIPTION OF THE DRAWINGS

The accompany drawings, which are included to provide a further understanding of the invention and are incorporated on and constitute a part of this specification, illustrate embodiments of the invention and together with the description serve to explain the principles of the invention. In the drawings.

DESCRIPTION OF THE EMBODIMENTS

Figure 1:
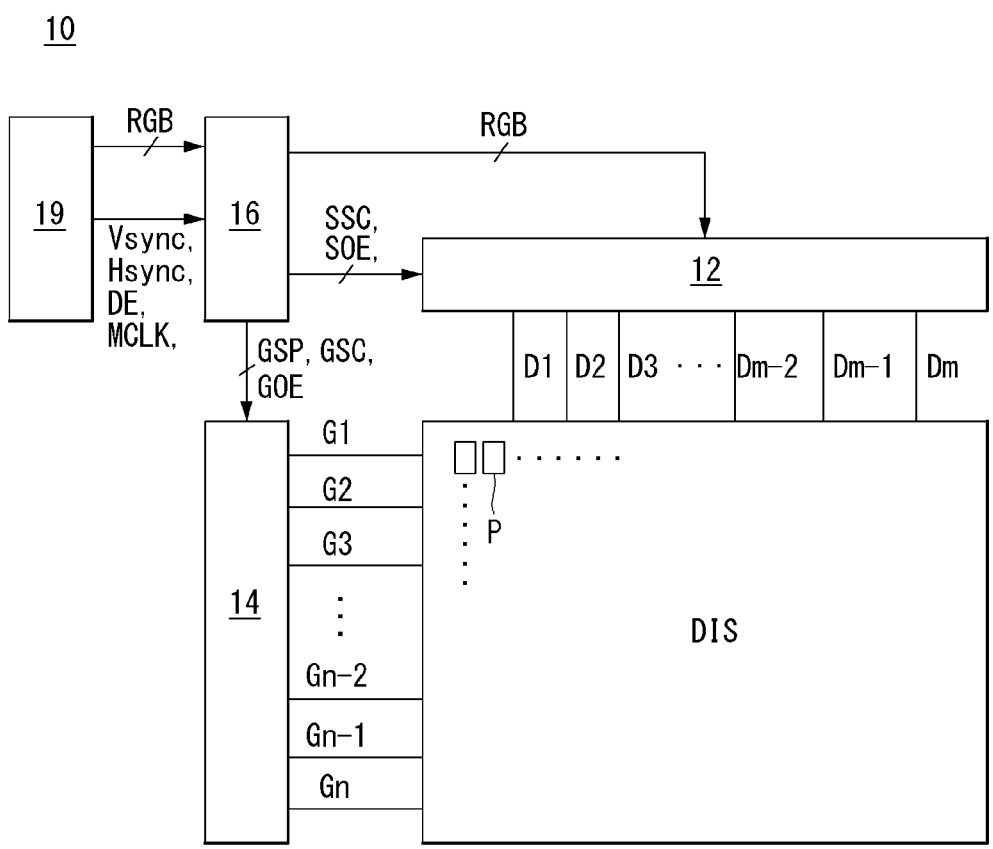
FIG. 1 is a view showing the configuration of an organic light-emitting display device according to an embodiment of the present invention.

Hereinafter, exemplary embodiments of the present invention will be described in detail with reference to the attached drawings. Throughout the specification, like reference numerals denote substantially like components. In describing the present invention, a detailed description of known functions or configurations related to the present invention will be omitted when it is deemed that they may unnecessarily obscure the subject matter of the present invention. In describing various exemplary embodiments, descriptions of the same or like components will be given in the beginning but omitted in other exemplary embodiments.

Although terms including ordinal numbers such as "first" and "second" may be used to describe various components, the components are not limited by the terms. The terms are used only to distinguish one component from other components.

Figure 2:
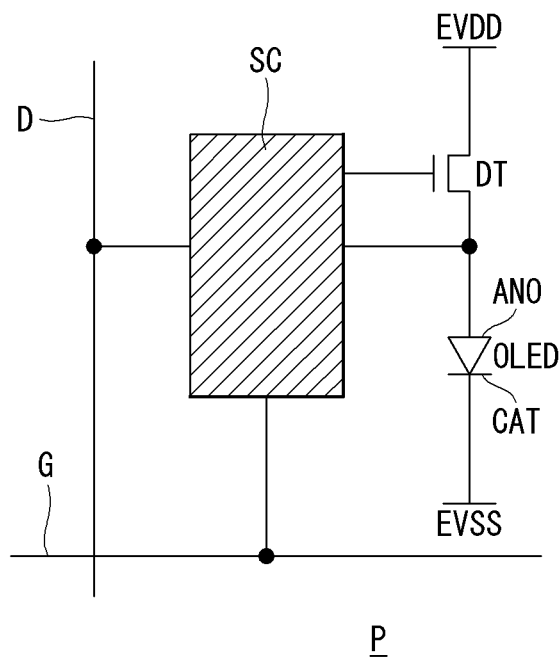
FIG. 2 is a view schematically showing the configuration of a pixel of FIG. 1.

FIG. 1 is a view showing the configuration of an organic light-emitting display device according to an embodiment of the present invention. FIG. 2 is a view schematically showing the configuration of a pixel of FIG. 1. All the components of the organic light-emitting display devices according to all embodiments of the present invention are operatively coupled and configured.

Referring to FIG. 1, an organic light-emitting display device 10 according to the present invention comprises a display drive circuit and a display panel DIS.

The display drive circuit comprises a data drive circuit 12, a gate drive circuit 14, and a timing controller 16, and writes a video data voltage of an input image to pixels on the display panel DIS. The data drive circuit 12 converts digital video data RGB received from the timing controller 16 to an analog gamma-compensated voltage and generates a data voltage. The data voltage outputted from the data drive circuit 12 is supplied to data lines D1 to Dm, where m is a positive integer. The gate drive circuit 14 sequentially supplies a gate signal synchronized with the data voltage to gate lines GI to Gn and selects pixels from the display panel DIS to write the data voltage, where n is a positive integer.

The timing controller 16 receives timing signals such as a vertical synchronization signal Vsync, a horizontal synchronization signal Hsync, a data enable signal DE, a main clock MCLK, etc. from a host system 19, and synchronizes the operation timings of the data drive circuit 12 and gate drive circuit 14. Data timing control signals for controlling the data drive circuit 12 comprise a source sampling clock SSC, a source output enable signal SOE, etc. Gate timing control signals for controlling the gate drive circuit 14 comprise a gate start pulse GSP, a gate shift clock GSC, a gate output enable signal GOE, etc.

The host system 19 can be implemented as any one of the following: a television system, a set-top box, a navigation system, a DVD player, a Blue-ray player, a personal computer PC, a home theater system, a phone system (e.g., a smart phone), a smart watch, or any device used in connection with a display. The host system 19 comprises a system-on-chip (SoC) with a scaler embedded in it, and converts digital video data RGB of an input image into a format suitable for display on the display panel DIS. The host system 19 transmits the timing signals Vsync, Hsync, DE, and MCLK, along with the digital video data, to the timing controller 16.

The display panel DIS comprises pixels P that are defined by the data lines D1 to Dm (m is a positive integer) and the gate lines G1 to Gn (n is a positive integer). Each pixel P comprises an organic light-emitting diode which is a self-luminous element.

As shown in FIG. 2, each pixel P comprises an organic light-emitting diode OLED, a driving transistor DT that controls the amount of current flowing in the organic light-emitting diode OLED, and a programming part SC that controls the operation of the driving transistor DT. The programming part SC is composed of one or more transistors and one or more capacitors, and controls voltages of primary nodes, for example, the gate and source electrodes of the driving transistor DT. In an example, the programming part SC writes a data voltage received from a data line D, in response to a gate pulse applied form a gate line G. The driving transistor DT supplies a drive current proportional to the amount of data voltage written to the programing part SC to the organic light-emitting diode OLED. The organic light-emitting diode OLED emits light in proportion to the amount of drive current supplied from the driving transistor DT. The organic light-emitting diode OLED comprises an anode ANO, a cathode CAT, and an organic compound layer interposed between the anode ANO and cathode CAT. The anode ANO is connected to the driving transistor DT.

Figure 3:
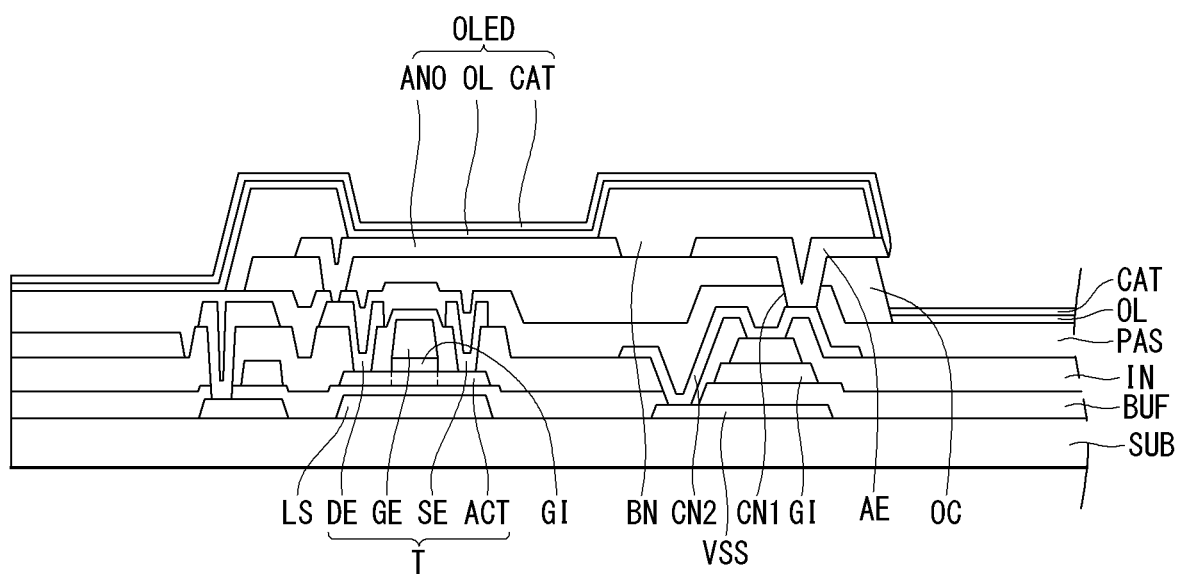
FIG. 3 is a cross-sectional view of an organic light-emitting display device according to an embodiment of the present invention.

FIG. 3 is a cross-sectional view of an organic light-emitting display device according to an embodiment of the present invention.

Referring to FIG. 3, the organic light-emitting display device according to the present invention comprises transistors T formed on a substrate SUB and organic light-emitting diodes OLED.

The substrate SUB can be made of a glass or plastic material. For example, the substrate SUB can be made of a plastic material such as PI (polyimide), PET (polyethylene terephthalate), PEN (polyethylene naphthalate), and PC (polycarbonate), and can have flexibility.

A light blocking layer LS and a low-level voltage line VSS are located on the substrate SUB. The light blocking layer LS is disposed to overlap with a semiconductor layer, particularly, channel, of the transistor T on the plane, and serves to protect oxide semiconductor devices from external light.

A buffer layer BUF is located on the substrate SUB to cover the light blocking layer LS and the low-level voltage line VSS. The buffer layer BUF serves to block ions or impurities diffused from the substrate SUB and prevent external moisture penetration.

A semiconductor layer ACT is located on the buffer layer BUF. An insulating layer formed on the buffer layer BUF to cover the semiconductor layer ACT is patterned so that a gate insulating layer GI is located where a gate electrode GE is formed. The gate insulating layer GI is for insulating the gate electrode GE, and can be made of a silicon oxide layer SiOx.

The gate electrode GE is located on the gate insulating layer GI. The gate electrode GE is disposed to face the semiconductor layer ACT, with the gate insulating layer GI in between. The gate electrode GE can be a single layer or multilayers made of any one selected from the group consisting of copper (Cu), molybdenum (Mo), aluminum (Al), chrome (Cr), gold (Au), titanium (Ti), nickel (Ni), neodymium (Nd), tantalum (Ta), and tungsten (W), or a combination thereof.

An interlayer insulating layer IN is disposed on the buffer layer BUF to cover the gate electrode GE. The interlayer insulating layer IN is for insulating the gate electrode GE and the source and drain electrodes SE and DE, and can include a silicon oxide layer (SiOx), a silicon nitride layer (SiNx), or multiple layers thereof.

The source and drain electrodes SE and DE and a second auxiliary connecting portion CN2 are located over the interlayer insulating layer IN. The source electrode SE and the drain electrode DE are spaced a predetermined distance apart. The source electrode SE comes into contact with one side of the semiconductor layer ACT via a source contact hole formed through the interlayer insulating layer IN. The drain electrode DE comes into contact with the other side of the semiconductor layer ACT via a drain contact hole formed through the interlayer insulating layer IN. The source electrode SE and the drain electrode DE can be a single layer or multiple layers. If the source electrode SE and the drain electrode DE is a single layer, they can be made of any one selected from the group consisting of molybdenum (Mo), aluminum (Al), chrome (Cr), gold (Au), titanium (Ti), nickel (Ni), neodymium (Nd), copper (Cu), or a combination thereof. If the source electrode SE and the drain electrode DE are composed of multiple layers, they can be composed of two layers of molybdenum/aluminum-neodymium, molybdenum/aluminum, titanium/aluminum, or copper/molytitanium, or three layers of molybdenum/aluminum-neodymium/molybdenum, molybdenum/aluminum/molybdenum, titanium/aluminum/titanium, or molytitanium/copper/molytitanium.

The second auxiliary connecting portion CN2 is formed through the interlayer insulating layer IN and connected to the first auxiliary connecting portion CN1. Also, the second auxiliary connecting portion CN2 is formed through the buffer layer BUF and the interlayer insulating layer IN and connected to the low-level voltage line VSS.

The semiconductor layer ACT, gate electrode GE, and source and drain electrodes SE and DE constitute the transistor T.

A passivation layer PAS is disposed to cover the transistor T and the second auxiliary connecting portion CN2. The passivation layer PAS is for protecting the transistor T, and can include a silicon oxide layer (SiOx), a silicon nitride layer (SiNx), or multiple layers thereof.

A planarization layer OC lies on the passivation layer PAS. The planarization layer OC is for evening out the differences in level in the underlying structure, and can be made of an organic material such as photoacryl, polyimide, benzocyclobutene resin, or acrylate resin. If necessary, either the passivation layer PAS or the planarization layer OC can be omitted.

The anode ANO and an auxiliary electrode AE are located on the planarization layer OC.

The anode ANO is connected to the drain electrode DE of the transistor T via a contact hole formed through the passivation layer PAS and the planarization layer OC. The auxiliary electrode AE is connected to the second auxiliary connecting portion CN2 via a contact hole formed through the passivation layer PAS. The auxiliary electrode AE can be made of the same material on the same layer as the anode ANO. In this case, there is no need to perform a separate process for forming the auxiliary electrode AE, thereby reducing the manufacturing time and costs.

A bank layer BN defining the boundary of the pixel P lies on the substrate where the anode ANO and the auxiliary electrode AE are formed. The bank layer BN can be made of an organic material such as polyimide, benzocyclobutene resin, or acrylate resin.

The bank layer BN can be disposed to expose the center of the anode ANO and cover the side edge of the anode ANO. It is desirable that the anode ANO is designed to have as large an exposed area as possible, so as to secure a sufficiently high aperture ratio. Moreover, the bank layer BN covers the top area of the auxiliary electrode AE but exposes the end of the auxiliary electrode AE. As a result, the auxiliary electrode AE has a protruding portion ed that is not covered by the bank layer BN.

An organic emissive layer OL is disposed to cover the anode ANO and the bank layer BN. Also, the organic emissive layer OL covers the side of the bank layer BN and makes contact with the top of the protruding portion ed of the auxiliary electrode AE. Moreover, the cathode CAT lies over the organic emissive layer OL. The cathode CAT can be formed widely across the entire surface of the substrate SUB. The cathode CAT can be formed of a transparent conductive material such as ITO (indium tin oxide) or IZO (indium zinc oxide), and can be made of magnesium (Mg), calcium (Ca), aluminum (Al), silver (Ag), or an alloy thereof that is made thin enough to allow light to pass through.

The cathode CAT is located on the organic emissive layer OL, and makes contact with the side of the protruding portion ed of the auxiliary electrode AE.

As explained previously, the auxiliary electrode AE is connected to the second auxiliary connecting portion CN2 via a contact hole formed through the passivation layer PAS. The second auxiliary connecting portion CN2 is electrically connected to the low-level voltage line VSS through the first auxiliary connecting portion CN1. The low-level voltage line VSS receives a low-level voltage EVSS. As a result, the cathode CAT receives the low-level voltage EVSS from the low-level voltage line VSS through the auxiliary electrode AE.

In general, the cathode CAT is formed across the entire surface of the display panel DIS, and the low-level voltage EVSS supplied through a pad located on the outer edge of the display panel DIS is supplied to each pixel P. Since the pad is located on the edge of the display panel DIS, the low-level voltage EVSS each pixel receives from the cathode CAT varies. The voltage variation of the cathode CAT causes a brightness variation. On the contrary, in the present invention, the pixel region P receives additional low-level voltage EVSS through the auxiliary electrode AE connected to the low-level voltage line VSS. As a result, the problem of brightness nonuniformity caused by the variation in low-level voltage EVSS between the pixels P can be addressed.

Particularly, the present invention requires no additional process or structure for connecting the cathode CAT to the auxiliary electrode AE. The cathode CAT can bring the cathode CAT into the auxiliary electrode AE by using the structural characteristics of the bank layer BN defining the boundaries between the pixels P and of the auxiliary electrode AE and the difference in step coverage between the organic emissive layer OL and the material of the cathode CAT. In the present invention, no additional structure is formed on the planarization layer OC to connect the cathode CAT and the auxiliary electrode AE; thus, it is possible to prevent any reduction in light-emitting area due to the structure for connecting the auxiliary electrode AE and the cathode CAT.

A method of forming a cathode according to an embodiment of the present invention will be described in specific details.

Figure 4:
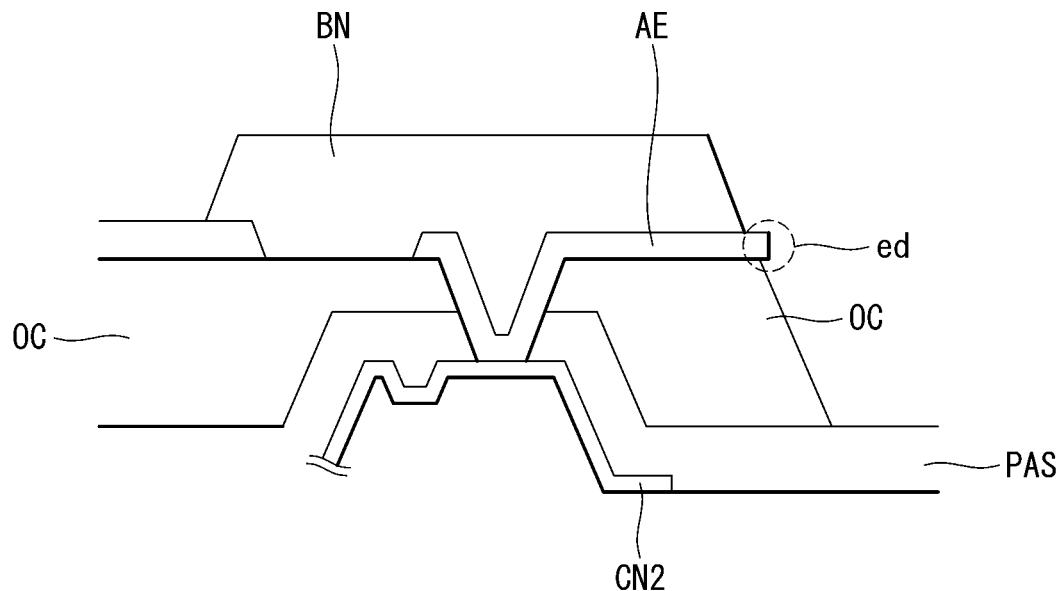
FIGS. 4 to 6 are views showing a manufacturing method of an organic light-emitting display device according to an embodiment of the present invention.
Figure 5:
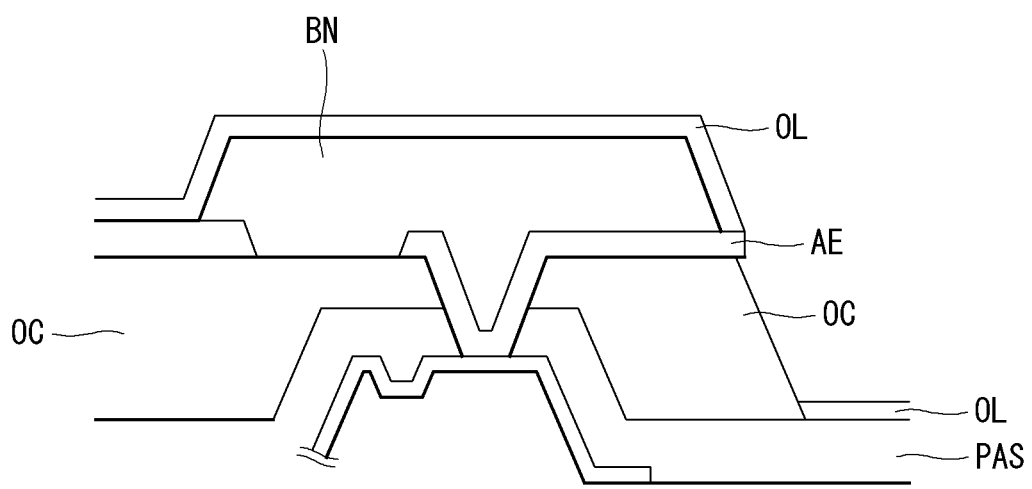
Figure 6:
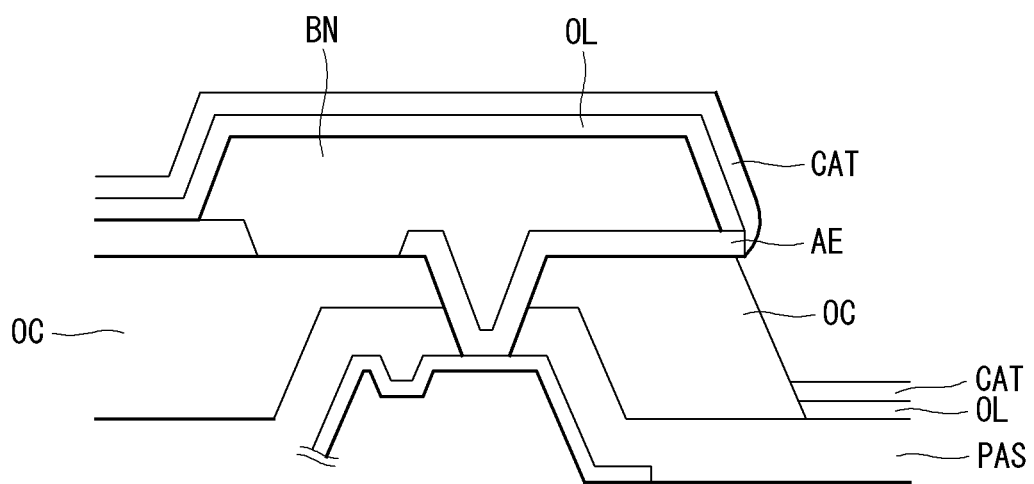

FIGS. 4 to 6 are views showing a method of forming a cathode according to an embodiment of the present invention.

Referring to FIG. 4, the planarization layer OC is formed on the passivation layer PAS after the passivation layer PAS is formed to cover the second auxiliary connecting portion CN2. Subsequently, a contact hole is formed through the planarization layer OC and the passivation layer PAS, and the auxiliary electrode AE is formed to fill in the contact hole. The auxiliary electrode AE can be formed of the same material in the same process as the anode ANO overlying the planarization layer OC.

The bank layer BN is formed to cover the end of the anode ANO and the auxiliary electrode AE. The bank layer BN does not fully cover the auxiliary electrode AE but exposes the end of the auxiliary electrode AE. As a result, the end of the auxiliary electrode AE has a protruding portion ed that is exposed through the bank layer BN.

Referring to FIG. 5, the organic emissive layer OL is formed to cover the bank layer BN. The organic emissive layer OL comprises an emissive layer that is made of one material that emits red, green, or blue light. The emissive layer can be made of a phosphorescent or fluorescent material. A hole injection layer, a hole transport layer, an electron transport layer, or an electron injection layer can be formed on or under the emissive layer. The hole injection layer, hole transport layer, electron transport layer, or electron injection layer can be made using one or multiple organic materials. The organic materials that form the organic emissive layer OL have poor step coverage characteristics. Therefore, the organic emissive layer OL is disposed to cover the top of the bank layer BN and the top of the protruding portion ed.

Referring to FIG. 6, the cathode CAT is formed after the organic emissive layer OL is formed. The cathode CAT can be formed of a transparent conductive material such as ITO (indium tin oxide) or IZO (indium zinc oxide), and can be made of magnesium (Mg), calcium (Ca), aluminum (Al), silver (Ag), or an alloy thereof that is made thin enough to allow light to pass through. The cathode CAT can be formed using a sputtering process. The metal materials used for the cathode CAT have good coverage characteristics unlike the organic emissive layer OL. Thus, the cathode CAT is deposited in such a way as to cover the side of the protruding portion ed as well as the top area of the organic emissive layer OL. As a result, the cathode CAT can be electrically connected to the auxiliary electrode AE.

In the embodiments of the present invention, a low-level voltage line is formed within the display panel, and a low-level voltage is supplied to the cathode by using the auxiliary electrode. Therefore, the variation in cathode voltage between pixels can be improved.

The manufacturing method of an organic light-emitting display device according to the embodiments of the present invention requires no additional structure for connecting the cathode CAT and the auxiliary electrode AE. In the embodiments of the present invention, the auxiliary electrode AE can be protruded in the process of forming the bank layer BN over the planarization layer OC stacked in a typical organic light-emitting display device, and the cathode CAT can be connected to the auxiliary electrode AE by using the difference in step coverage between the organic emissive layer OL covering the bank layer BN and the cathode CAT. As a result, the process can be simplified, and any reduction in light-emitting area due to the additional structure can be prevented.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic light-emitting display device comprising:
 a low-level voltage line that receives a low-level voltage;
 a plurality of insulating layers that lie over the low-level voltage line;
 an auxiliary electrode that lies on an uppermost insulating layer among the insulating layers and is formed through the insulating film layer and electrically connected to the low-level voltage line;
 a bank layer that lies over the auxiliary electrode and defines a light-emitting area where an organic light-emitting diode is located; and
 a cathode of the organic light-emitting diode, the cathode disposed on the bank layer and contacting a side of the auxiliary electrode,
 wherein the cathode of the organic light-emitting diode is connected to a side of a protruding portion where the auxiliary electrode protrudes from the bank layer.

2. The organic light-emitting display device of claim 1, wherein the insulating layers comprise:
 a passivation film that lies over the low-level voltage line; and
 a planarization film that covers the passivation film,
 wherein the bank layer lies over the planarization film to expose a part of the end of the auxiliary electrode.

3. The organic light-emitting display device of claim 2, wherein the organic light-emitting diode further comprises an anode that lies on the planarization film,
 wherein the auxiliary electrode is made of the same material as the anode of the organic light-emitting diode.

4. The organic light-emitting display device of claim 3, wherein the organic light-emitting diode further comprises an organic emissive layer that covers the anode and the bank layer and lies under the cathode.

5. The organic light-emitting display device of claim 1, wherein the low-level voltage line is located in the light-emitting area.

6. A manufacturing method for an organic light-emitting display device, the method comprising:
 forming a plurality of insulating layers over a low-level voltage line that receives a low-level voltage;
 forming an auxiliary electrode that is formed through the insulating layers and electrically connected to the low-level voltage line;
 forming a bank layer over the auxiliary electrode to define a light-emitting area where an organic light-emitting diode is located; and
 forming a cathode of the organic light-emitting diode to cover the bank layer and to make contact with a side of the auxiliary electrode,
 wherein the cathode of the organic light-emitting diode is formed to connect to a side of a protruding portion where the auxiliary electrode protrudes from the bank layer.

7. The method of claim 6, wherein the forming of the insulating layers comprises:
 forming a passivation film over the low-level voltage line; and
 forming a planarization film on the passivation film,
 wherein the bank layer is formed on the planarization film to expose a part of the end of the auxiliary electrode.

8. The method of claim 7, further comprising:
 forming an anode of the organic light-emitting diode on the planarization film by using the same material as the auxiliary electrode before the forming of the cathode of the organic light-emitting diode; and
 forming an organic emissive layer of the organic light-emitting diode to cover the anode and the bank layer.

9. The method of claim 8, wherein the cathode of the organic light-emitting diode is formed using a transparent metal material having a better step coverage than the organic emissive layer.

* * * * *